(12) United States Patent
Lien et al.

(10) Patent No.: US 6,303,955 B1
(45) Date of Patent: Oct. 16, 2001

(54) DYNAMIC RANDOM ACCESS MEMORY WITH SLANTED ACTIVE REGIONS

(75) Inventors: Wan-Yih Lien, Hsinchu; Meng-Jaw Cheng, Hsinchu Hsien, both of (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/439,988

(22) Filed: Nov. 15, 1999

(30) Foreign Application Priority Data

Oct. 15, 1999 (TW) ................................................ 088117900

(51) Int. Cl.[7] .......................... H01L 27/108; H01L 29/76; H01L 29/94; H01L 31/119

(52) U.S. Cl. ........................... 257/296; 257/303; 257/907

(58) Field of Search ..................................... 257/296, 300, 257/303, 304, 907, 306, 309; 438/253, 241, 396, 398

(56) References Cited

U.S. PATENT DOCUMENTS

| | | | |
|---|---|---|---|
| 5,149,665 | * 9/1992 | Lee | 438/257 |
| 5,298,775 | * 3/1994 | Ohya | 257/211 |
| 5,374,576 | * 12/1994 | Kimura et al. | 438/253 |
| 5,612,241 | * 3/1997 | Arima | 428/241 |
| 5,747,844 | * 5/1998 | Aoki et al. | 257/296 |
| 6,074,908 | * 6/2000 | Huang | 438/241 |
| 6,077,738 | * 6/2000 | Lee et al. | 438/241 |
| 6,127,260 | * 10/2000 | Huang | 438/629 |

* cited by examiner

*Primary Examiner*—Olik Chaudhuri
*Assistant Examiner*—Hoai Pham

(57) ABSTRACT

A structure of dynamic random access memory with slanted active regions, comprising: a substrate; a plurality of slanted active regions formed on the substrate, wherein each of the plurality of slanted active regions has a bit line contact; a plurality of word line regions formed on the substrate to control transistors of the dynamic random access memory; a plurality of bit line regions formed on the substrate, wherein each of the bit line regions cross the bit line contact hole so that the bit line contact hole is completely covered by the bit line regions; a plurality of capacitors formed between the plurality of bit line regions.

3 Claims, 3 Drawing Sheets

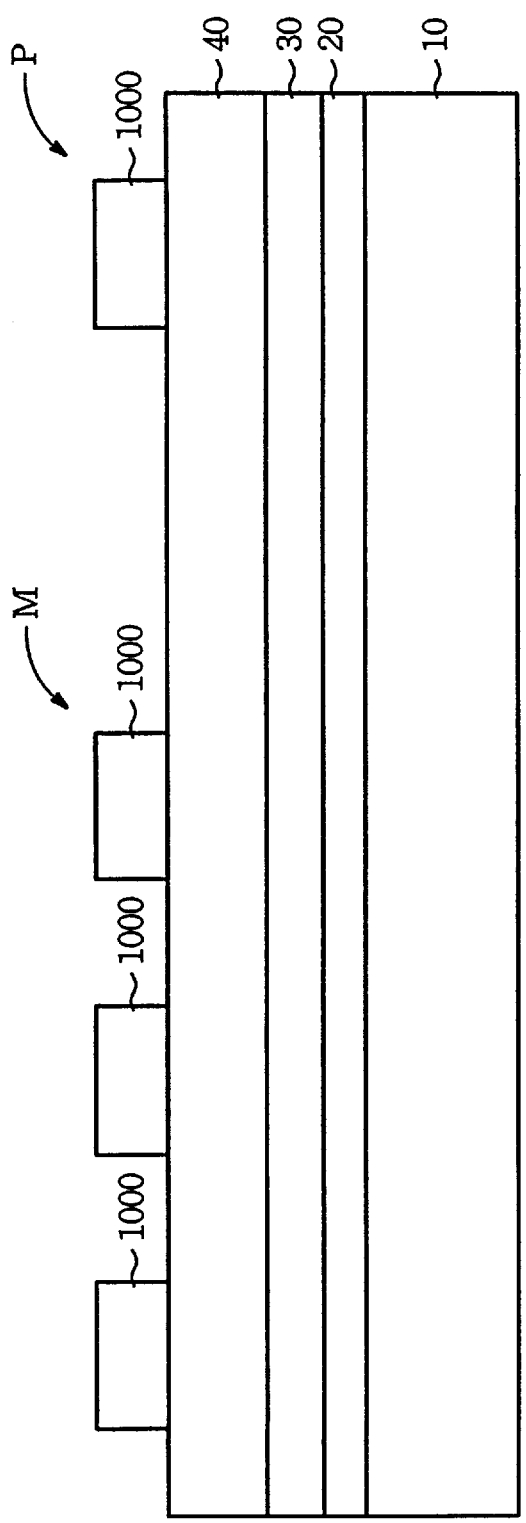
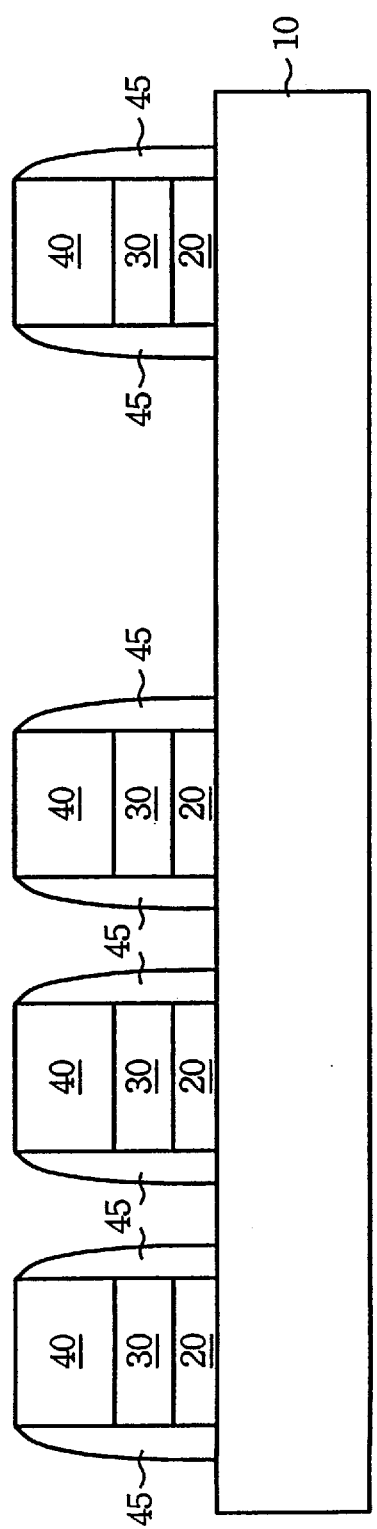

DYNAMIC RANDOM ACCESS MEMORY WITH SLANTED ACTIVE REGIONS

FIELD OF THE INVENTION

The present invention relates to a layout structure of dynamic random access memory, more specifically, to a layout structure of dynamic random access memory with slanted active regions.

BACKGROUND OF THE INVENTION

According to the fabrication of semiconductor devices or integrated circuits, dynamic random access memory (DRAM) is an important microelectronic device and it is a storage device for storing information. Typically, a DRAM cell consists of a capacitor and a comparator. The capacitor in a DRAM cell stores electrostatic charge and the comparator in the DRAM compares the voltage level in the capacitor with a standard voltage level to determine that the voltage level in the capacitor is high level or low level. In other words, the capacitor has a high-level charge storage, the data recorded in the capacitor is indicated as "1". Similarly, the capacitor has a low-level charge storage, the data recorded in the capacitor is indicated as "0".

The capacitor of a DRAM cell is fabricated on the drain region of the cell and the capacitor electrically connects to the active region of the cell by using a contact plug between the capacitor and the active region. The active region electrically connects to the bit lines of the DRAM cell by using a contact window. Consequently, the manufacture of a DRAM cell must use two etching masks, one etching mask is adapted for defining the electrical contact region of the capacitor region in order to align the capacitor region with the drain region of the cell, another etching mask is adapted for defining the capacitor node of a crown-type bottom electrode.

Referring to FIG. 6, a layout structure of a DRAM cell is shown. A DRAM has several active regions 400 that are formed on the semiconductor substrate and the active regions 400 have a square shape. Several word line regions 500 are formed on the substrate for controlling the transistors of the DRAM. Additionally, several bit line regions 100 are formed on the substrate and each of the bit line regions is protected by spacers 110 for insulating isolation. Besides, the spacers are formed from silicon nitride material. The bit line contact holes 200 are formed in interlayer dielectric layers of the DRAM and the contact holes 200 cross the bit line regions 100 and the active regions 400 for electrical coupling between the bit line regions 100 and the active regions 400.

The bit line contact holes 200 are formed on the active regions 400 and the bit line regions then refill to cover on/in the bit line contact holes 200 for electrical coupling. Nevertheless, the bit line contact holes 200 are partially covers on the active regions 400 and the bit line regions 100 are partially on the bit line contact holes 200. Thus, the bit line contact holes 200 between the bit line regions 100 and the active regions 400 is hard to be completely covered. Furthermore, the substrate between the bit line regions 100 is indicated as a capacitor regions 300, in other words, the capacitors of the DRAM are formed on the active regions 400 between the bit line regions 100 for connecting the drain regions of the DRAM. During the etching process of the capacitor regions 300, there is no good isolation reliability around the bit line contact holes 200 and it can not make sure the isolation between the capacitors and the bit lines.

The layout structure of the DRAM depicted in FIG. 6 includes two electrical contacts, the first electrical contact is located between the bit line regions and the active regions, the second electrical contact is located between the capacitors and the active regions of the DRAM. The first electrical contact is located at the contact hole regions of the bit lines and it is formed by using lithography process and the etching process to etch interlayer dielectric layers for forming contact holes exposing the partial portion of the active regions and the bit line regions. The conductive material is refilled into the contact holes to serve as the electrical connection between the bit lines and the active regions. The second electrical contact is formed by using lithography and etching process during the formation of the capacitor and the contact holes of the drain regions formed in the interlayer dielectric layer. Consequently, as the contact hole of the drain region is precisely defined in position, the electrical contacts of the drain regions have good reliability. The manufacture of the first electrical contact is to form a bit line contact hole for the connection between the bit lines and the active region and the electrical conductive material is adapted for the connection between the bit line and the active region. In prior art, the bit line region do not fully overlaps on the active region and a bad insulating isolation exists therein.

The trend of fabricating DRAM cells is to shrink the size of the cells, that is, to decrease the planar area of the cells for increasing the device integration on silicon wafers. Thus, the distance between the bit lines of DRAM is shrunken to increase the integrity of integrated circuits. As the distance between the bit lines is shrunken, the isolation reliability between the bit line regions and the contact plugs of the capacitors between the bit line regions is simultaneously degraded. At the same time, to simplify the fabrication of the DRAM is an important issue for fabricating the DRAM. Therefore, it is needed that the layout structure of the active regions and the bit line regions to improve the isolation reliability between the bit line regions and the capacitor regions, not to reduce the integrity density of the DRAM.

SUMMARY OF THE INVENTION

The present invention provides a layout structure of DRAM with slanted active regions and a method to manufacture the structure. Initially, slanted active regions are formed on a substrate and the active regions have a S-type shape. Afterwards, word line regions for controlling the transistors of DRAM are formed on the substrate. Bit line regions are formed on the substrate and cross the slanted active regions so that the first ends and the second ends of the active regions are respectively located on the first side and the second side of the bit line regions. Furthermore, there are bit line contact holes on the slanted active regions and the bit line regions fully cover on the bit line contact holes to form an electrical connection between the slanted active regions and the bit line regions. Finally, an etching process is performed on the interlayer dielectric layers between the bit line regions to form capacitor regions.

The present invention provides a structure of DRAM with slanted active regions. The bit line regions could fully cover on the bit line contact holes of the slanted active regions to prevent the bit line contact holes from the connection with the capacitor regions.

The present invention provides a layout structure of DRAM with slanted active regions. The bit line regions of DRAM cross the slanted active regions and the spacers of the bit line regions protect the bit line contact holes on the slanted active regions to prevent the bit line contact hole from being etched during the etching process of the capacitor regions of DRAM.

The present invention provides a method for fabricating DRAM with slanted active regions. Slanted active regions are defined in the semiconductor substrate and the bit line regions completely cover on the bit line contact holes on the active regions for protecting the bit line contact holes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a cross-section view of a substrate in accordance with the present invention, a polysilicon layer, a metal silicide layer and a silicon nitride layer are deposited on a semiconductor substrate to form a stacked structure, a photoresist layer is defined on the stacked structure to define a gate structure of integrated circuits, there are a memory cell region and a peripheral circuit region on the semiconductor substrate;

FIG. 2 shows a cross-section view of a substrate in accordance with the present invention, the stacked structure is etched by using a lithography process and an etching process to form a gate structure on the substrate, then silicon nitride insulating spacer structure are formed on the sidewalls of the gate structure;

DETAILED DESCRIPTION OF THE PREFERRED EMBODIMENT

Figure 3:
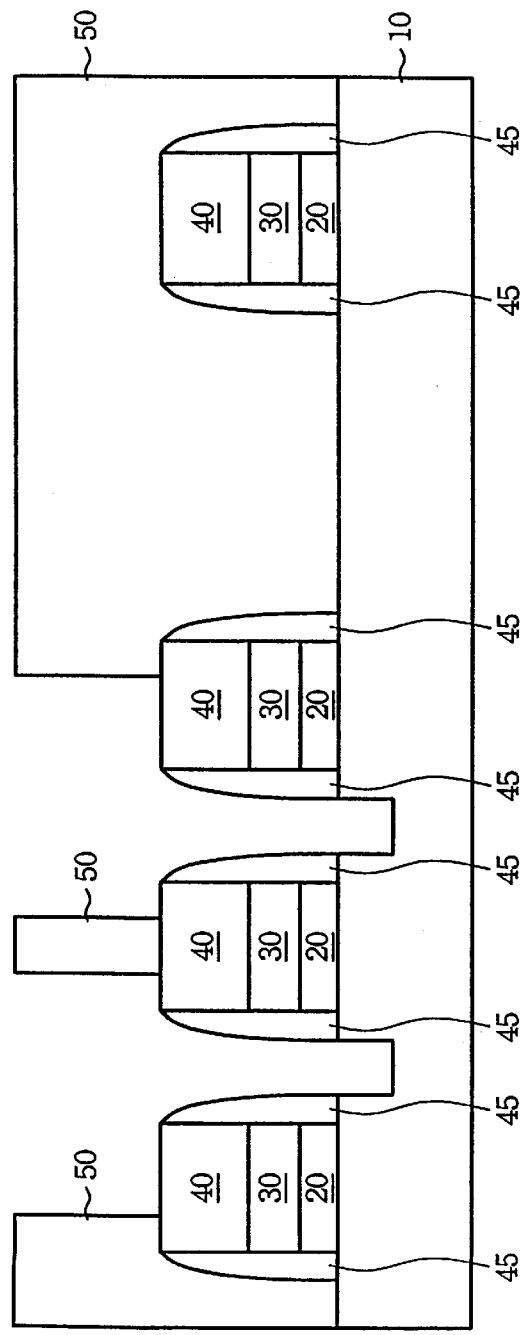
FIG. 3 shows a cross-section view of a substrate in accordance with the present invention, a silicon nitride is conformally deposited on the gate structure and the semiconductor substrate, and the capacitor node of DRAM is defined by using a photolithography process and an etching process, the semiconductor substrate arounded the gate structure of the memory cell region is etched to form trenches.

The present invention discloses a layout structure of a DRAM with slanted active regions and a method for manufacturing the above mentioned layout structure. A substrate is served as a base of a DRAM. Slanted active regions are formed in the substrate and word line regions are formed on the substrate for controlling the transistors of DRAM. Bit line regions is formed on the substrate for crossing the slanted active regions and the bit line contact holes of the slanted active regions are fully covers by the bit line regions. Capacitor regions are formed on the substrate between the bit line regions and the fabrication of a DRAM is finished. Referring to FIGS. 1–5 and the following descriptions, the layout structure of the DRAM with slanted active regions and the method for fabricating the structure are explained in detail.

Referring to FIG. 1, a substrate 10 is provided for the base of DRAM and a polysilicon layer 20 is deposited on the substrate 10. The polysilicon layer 20 is doped by using conducting dopants and has a thickness between from 500 to 1000 angstroms. A silicon tungsten layer 30, having a thickness between about 1000 and 2000 angstroms, is then deposited on the polysilicon layer 20. A silicon nitride layer 40 is deposited on the silicon tungsten layer 30 and the layer 40 has a thickness of between about 1500 and 3000 angstroms. After the above thin film layer is deposited on the substrate 10, a photoresist pattern 1000 is defined on the silicon nitride layer 40 for defining a memory cell region M and the bit line region of a peripheral circuit region P.

Referring to FIG. 2, the silicon nitride layer 40, the silicon tungsten layer 30 and the polysilicon layer 20 are etched by using anisotropical etching process to form the memory cell region M and the bit line region of the peripheral circuit region P. After the bit line structure is formed, a silicon nitride layer having a thickness of between about 500 to 1500 angstroms covers on the substrate 10 and, the surface and the sidewalls of the bit line structure. Subsequently, the silicon nitride layer is etched to remove the silicon nitride layer on the surface of the bit line structure and the substrate 10 for forming insulating spacers 45 on the sidewalls of the bit line structure.

The bit line structure as shown in FIG. 2, the polysilicon layer 20 is indicated as the bit line of the memory and the silicon nitride layer 40 and the insulating spacers 45 formed from silicon nitride material serve as an etching hard mask in following process steps for protecting the bit line structure from etching.

Referring to FIG. 3, an interlayer dielectric layer 50 is deposited on the surface of the silicon nitride layer 40, the insulating spacers 45 and the substrate 10. Furthermore, the interlayer dielectric layer 50 is formed from silicon oxide material. In a preferred embodiment of the present invention, the interlayer dielectric layer 50 is formed from boron-phosphorus-doped-silicon glass (BPSG) and has a thickness between from 6000 to 12000 angstroms. In virtue of the process design of a DRAM cell, the thickness of the interlayer dielectric layer 50 is determined by the capacitance of a capacitor.

Still referring to FIG. 3, an etching process is performed on the interlayer dielectric layer 50 by using a photolithography process and an etching process to define the opening of the capacitor of a memory cell. In the etching process, the silicon nitride layer 40 and the insulating spacers serve as an etching hard mask to protect the bit line region. The etching process is a reactive-ion-etching (RIE) process under a pressure of between from 30 to 50 mtorrs, by using a radio-frequency power of between about 1200 and 1800 watts and the reaction gas consisting of $C_4F_8$, Ar and $CH_2F_2$. The flow rate of $C_4F_8$, Ar and $CH_2F_2$ is respectively between about 5 and 9 sccm, between about 400 and 600 sccm and between about 3 and 5 sccm. The interlayer dielectric layer 50 is etched by using the above recipe to maintain the high etching selectivity between silicon nitride material and silicon oxide material to prevent the silicon nitride layer 40 or the insulating spacers 45 from etching damage. After the opening of the capacitor is defined, the peripheral circuit region P is covered by the interlayer dielectric layer 50 to prevent the region P from any influence during the fabrication process of the capacitor in DRAM. In the present invention, an opening of a capacitor is formed in the interlayer dielectric layer and the capacitor is formed on and in the interlayer dielectric layer. The method for fabricating the capacitor above and in the bit line region is indicated as a fabricating method of a crown-type capacitor. The structure fabricated by the foregoing method is called as a capacitor-on-bitline (COB) structure.

Figure 4:
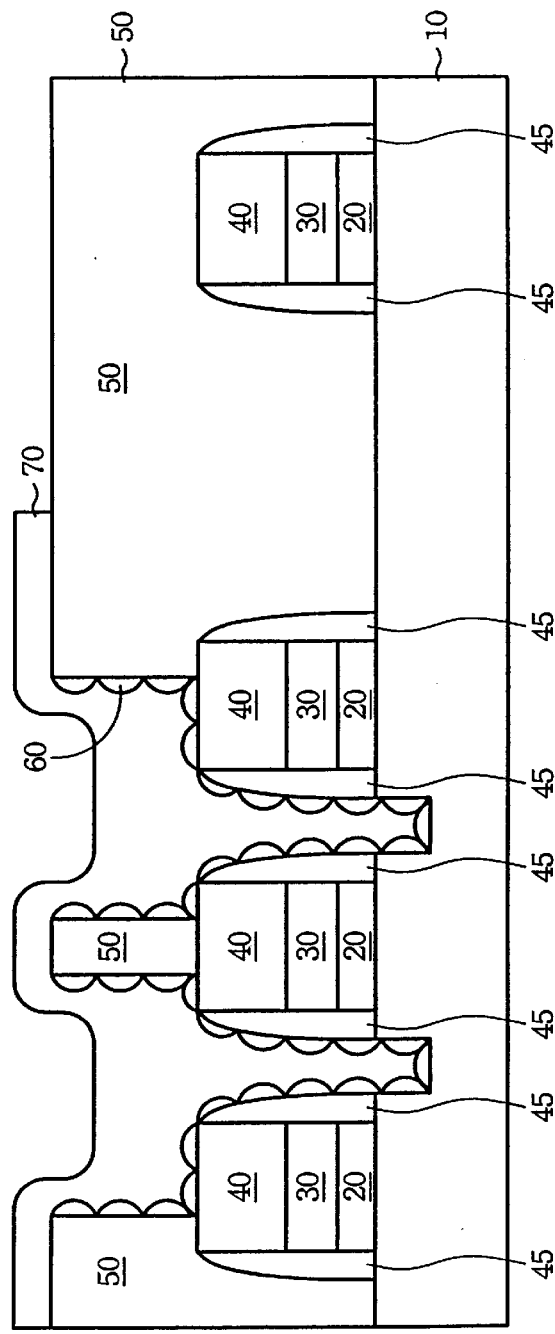
FIG. 4 shows a cross-section view of a substrate in accordance with the present invention, a rugged polysilicon layer is deposited on the gate structure, the silicon oxide layer and the semiconductor substrate to finish the fabrication of a capacitor.

Referring to FIG. 4, a rugged polysilicon layer 60 is deposited on the surface of the capacitor region and the interlayer dielectric layer. Subsequently, the rugged polysilicon layer 60 on the capacitor region is removed to define the electrode of the capacitor to increase the surface area of the electrode and the capacitance of the capacitor. At last, a cell plate 70 is defined on the opening of the capacitor to serve as another electrode of the capacitor. Additionally, a capacitor dielectric layer (not shown) is formed between the cell plate 70 and the rugged polysilicon layer 60 for maintain an electric field in the capacitor for charge storage.

Figure 5:
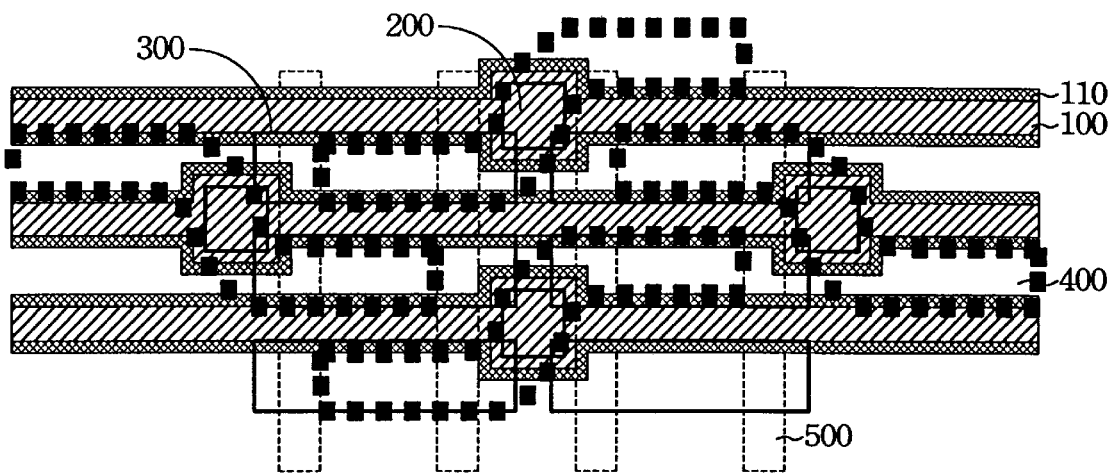
FIG. 5 shows a top view of the layout structure of DRAM in accordance with the present invention, the active regions in the layout structure of DRAM are slanted and a contact hole of the bit lines of DRAM is located between the two ends of a slanted active region so that the bitlines cross the slanted active regions and completely covers the contact holes of the bitlines for making sure that the isolation of the capacitors and the bitlines.
Figure 6:
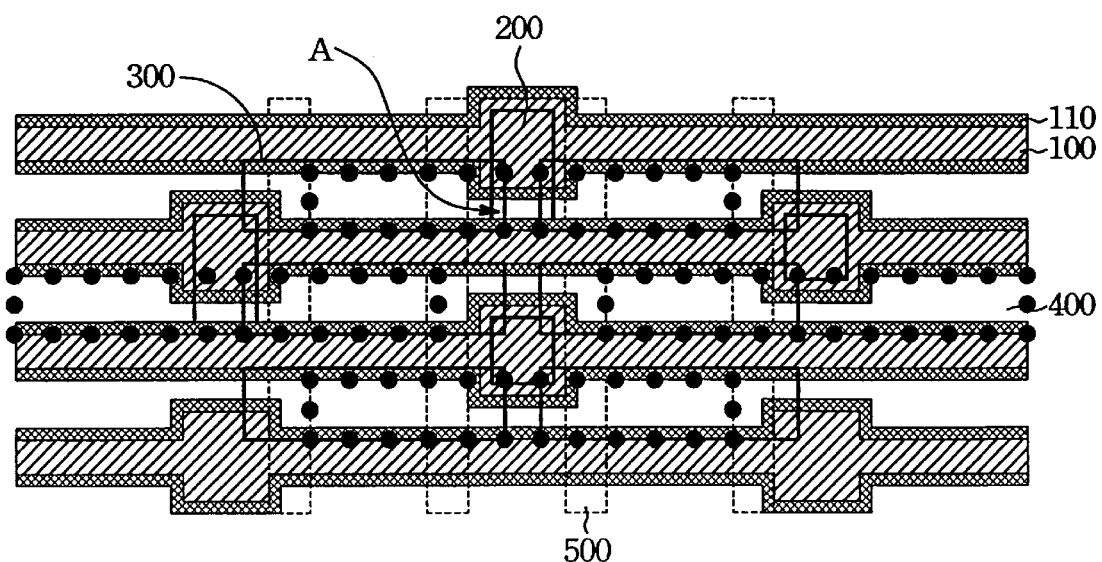
FIG. 6 shows a top view of the layout structure of DRAM in accordance with the prior art, the active regions have a square shape and partially overlap with the contact holes of the bit lines of the memory cells so that the bitline contact holes between the bitlines and the active regions are not covered by the bitlines, the isolation effect between the capacitors and the bitline contact holes will be influenced, when the capacitor regions are formed.

In the above descriptions, a crown-type capacitor structure is formed on a substrate, more precisely, on a bit line region. The region of the capacitor and the bit line structure is shown in the layout structure according to FIG. 5. Referring to FIG. 5, several slanted active regions 400 are formed in the substrate and word line regions 500 is formed on the substrate to control the transistors of the DRAM. Several bit line regions 100 is formed on the substrate and cross the slanted active regions 400. Besides, the first end and the second end of the slanted active region 400 respectively locate on the first side and the second side of the bit line region 100. One of the slanted active regions 400 has a bit line contact hole 200 that is covered by the bit line regions 100. The overlap region of the bit line region 100 and the bit line contact hole 200 has a larger area than that in prior art, the bit line regions 100 can fully covers on the bit line contact holes 200.

The capacitor regions 300 of the DRAM are defined in the interlayer dielectric layers between the two bit line regions 100. The capacitor regions 300 is called as a crown-type capacitor. In the present invention, the bit line regions, the slanted active regions are adapted for solving the overlapping area between the slanted active regions and the capacitor regions. Each of the slanted active regions have S-type shape and has two ends, the first ends and the second ends. The first end and the second end are respectively located on the first side and the second side of the bit line regions 100. Moreover, the bit line regions cross the bit line contact holes 200 of the slanted active regions 400 and the holes 200 is fully covered under the bit line regions 100. By using the slanted active regions 400 in the present invention, the bit line contact holes 200 are completely covers by the bit line regions 100. The bit line regions 100 are protected by insulating spacers 110 formed from silicon nitride material. According to the foregoing layout structure, during the etching process for defining the capacitors in DRAM, the bit line contact holes 200 are protected for the etching damage to make sure the isolation reliability between the bit line regions and the capacitor regions.

While the preferred embodiment of the invention has been illustrated and described, it will be appreciated that various changes can be made therein without departing from the spirit and scope of the invention.

What is claimed is:

1. A capacitor over bit line (COB) structure of a dynamic random access memory with slanted active regions, comprising:
    a plurality of slanted active regions on a substrate, each of said slanted active regions having a center node region and a first straight-arm region and a second straight-arm region that are arranged in quasi-S-shape, said center node regions are arranged in lines, said first and said second straight-arm regions are perpendicularly lying in an opposite direction of said lines of said center node regions, and said first straight-arm regions of said one line of said center node regions and said second straight-arm regions of said next line of said center node regions are alternatively and parallel arranged;
    a plurality of parallel word lines on said substrate that perpendicularly cross said first and said second straight-arm regions of said slanted active regions;
    a plurality of bit line contacts on said center node regions of said slanted active regions;
    a plurality of parallel bit lines over said substrate and said word lines, said bit lines are located between said first and said second straight-arm regions that are contiguous and completely cover said bit line contacts;
    a plurality of insulating spacers on sidewalls of said bit lines; and
    a plurality of crown-type capacitors located between said insulating spacers that are adjacent and between said bit line contacts.

2. The structure according to claim 1, wherein said insulating spacers are formed from silicon nitride material to serve as an etching stop during etching of a plurality of openings that serves as a space for said capacitor.

3. The structure according to claim 1, further comprises a peripheral logic circuit region formed on said substrate and being protected by a silicon oxide layer.

* * * * *